(12) United States Patent
Kanner et al.

(10) Patent No.: US 11,467,191 B2
(45) Date of Patent: Oct. 11, 2022

(54) WETTING CURRENT CONTROL FOR INPUT CIRCUIT

(71) Applicant: Thales Canada Inc, Toronto (CA)

(72) Inventors: Abe Kanner, Toronto (CA); Serge Kniazev, Toronto (CA); Peter Spasopoulos, Toronto (CA); Carl Schwellnus, Toronto (CA)

(73) Assignee: THALES CANADA INC, Toronto (CA)

( * ) Notice: Subject to any disclaimer, the term of this patent is extended or adjusted under 35 U.S.C. 154(b) by 436 days.

(21) Appl. No.: 16/566,366

(22) Filed: Sep. 10, 2019

(65) Prior Publication Data
US 2020/0081038 A1   Mar. 12, 2020

Related U.S. Application Data

(60) Provisional application No. 62/729,278, filed on Sep. 10, 2018.

(51) Int. Cl.
| | | |
|---|---|---|
| *G01R 19/00* | (2006.01) | |
| *H02M 3/335* | (2006.01) | |
| *G05F 3/02* | (2006.01) | |
| *H01H 1/60* | (2006.01) | |
| *H02M 1/08* | (2006.01) | |
| *H02M 1/00* | (2006.01) | |

(52) U.S. Cl.
CPC .......... *G01R 19/0092* (2013.01); *G05F 3/02* (2013.01); *H01H 1/605* (2013.01); *H02M 3/33523* (2013.01); *H02M 1/0022* (2021.05); *H02M 1/082* (2013.01)

(58) Field of Classification Search
CPC ...... G01R 19/0092; G05F 3/02; H01H 1/605; H02M 1/082; H02M 1/0022
See application file for complete search history.

(56) References Cited

U.S. PATENT DOCUMENTS

| | | |
|---|---|---|
| 3,579,090 A | 5/1971 | Madsen |
| 4,835,649 A | 5/1989 | Salerno |

(Continued)

FOREIGN PATENT DOCUMENTS

WO   2016081009 A1   5/2016

OTHER PUBLICATIONS

"22 Channel Multiple Switch Detection Interface with Programmable Wetting Current"; Free Scale Semiconductor Advance Informaton; http://cache.freescale.com/files/analog/doc/data_sheet/MC33978.pdf; Dec. 1, 2014; pp. 1-65.

(Continued)

*Primary Examiner* — Dominic E Hawkins
(74) *Attorney, Agent, or Firm* — Hauptman Ham, LLP

(57) ABSTRACT

A circuit for controlling an input current, the circuit includes a first input port configured to receive the input current. A current detector detects an input current value of the input current and generates a control signal indicative of the input current value. A first output port outputs an output current to a load. A second output port receives the output current from the load. A control circuit provides a low-impedance path in parallel with the load in response to the control signal indicating the input current value is below a threshold value.

20 Claims, 11 Drawing Sheets

(56) References Cited

U.S. PATENT DOCUMENTS

| | | | | |
|---|---|---|---|---|
| 5,383,194 | A | * | 1/1995 | Sloan .................... G01R 31/30 714/724 |
| 5,866,869 | A | | 2/1999 | Schneider et al. |
| 6,049,447 | A | * | 4/2000 | Roesch ................. H02H 9/025 361/58 |
| 6,794,601 | B2 | | 9/2004 | Norris et al. |
| 6,800,965 | B1 | | 10/2004 | Turner et al. |
| 8,603,323 | B2 | | 12/2013 | Kranendonk et al. |
| 9,465,075 | B2 | | 10/2016 | Edwards et al. |
| 9,466,444 | B2 | | 10/2016 | Dickey |
| 9,715,246 | B2 | | 7/2017 | Edwards et al. |
| 9,746,867 | B2 | | 8/2017 | Hess et al. |
| 9,778,668 | B2 | | 10/2017 | Edwards et al. |
| 9,837,219 | B2 | | 12/2017 | Jefferies |
| 2011/0125431 | A1 | | 5/2011 | Adest et al. |
| 2011/0273812 | A1 | | 11/2011 | Beer et al. |
| 2012/0032663 | A1 | | 2/2012 | Divan |
| 2012/0281327 | A1 | | 11/2012 | Duan et al. |
| 2013/0285629 | A1 | | 10/2013 | Sobolewski |
| 2014/0312871 | A1 | | 10/2014 | Alley |
| 2014/0320195 | A1 | | 10/2014 | Desai et al. |
| 2015/0002052 | A1 | | 1/2015 | Hebborn |
| 2015/0348721 | A1 | * | 12/2015 | Dickey .................... H01H 1/60 307/137 |
| 2016/0131713 | A1 | | 5/2016 | Edwards et al. |
| 2016/0238658 | A1 | * | 8/2016 | Edwards ............ G01R 31/3277 |
| 2016/0282896 | A1 | * | 9/2016 | Edwards .................. G05F 5/00 |
| 2016/0306375 | A1 | * | 10/2016 | Hess ........................ G05F 3/02 |
| 2017/0038782 | A1 | | 2/2017 | Lucas et al. |
| 2017/0178825 | A1 | * | 6/2017 | Glosser .............. G01R 31/3278 |
| 2017/0250043 | A1 | | 8/2017 | Hurwitz et al. |
| 2018/0024585 | A1 | * | 1/2018 | Bavois ..................... G05F 5/00 323/303 |

OTHER PUBLICATIONS

"33 Channel Multiple Switch Detection Interface with Programmable Wetting Current", https://www.nxp.com/docs/en/data-sheet/CD1030.pdf; Mar. 31, 2017; pp. 1-67.

Griffith, J., "Automotive Body Control Modules", http://innovation-destination.com/2018/02/22/the-multi-switch-detection-inteface-integrated-features-for-small-more-efficient-designs/; Mar. 6, 2018; pp. 1-5.

"LMR33620 Simple Switcher 3.8-V to 36-V, 2-A Synchronous Step-Down Voltage Converter", http://ti.com/lit/ds/symlink/lmr33620.pdf; Feb. 28, 2018; pp. 1-40.

"Automotive Multi-Switch Detection Interface Reference Design", http://www.ti.com/lit/ug/tiduc45/tiduc45.pdf; Dec. 31, 2016; pp. 1-52.

International Search Report and Written Opinion issued in corresponding International Application No. PCT/IB2019/057626, dated Nov. 27, 2019, pp. 1-10, Canadian Intellectual Property Office, Quebec, Canada.

European Search Report issued in corresponding European Application No. 19860530.5, dated Apr. 22, 2022, pp. 1-8, European Patent Office, Munich, Germany.

* cited by examiner

US 11,467,191 B2

WETTING CURRENT CONTROL FOR INPUT CIRCUIT

PRIORITY CLAIM

The present application claims the priority of U.S. Provisional Application No. 62/729,278, filed Sep. 10, 2018, which is incorporated herein by reference in its entirety.

BACKGROUND

Wetting current is a minimum current that a sourcing device (henceforth the device) needs to switch in order to ensure that the switching contacts remain clean and thereby maintain the reliability of the device. If the current sourced to the device is less than the wetting current value recommended by the manufacturer of the device, the reliability of the device cannot be assured. This issue affects relay-based circuits where a minimum switching current is required for the circuit to function properly.

With the advent of electronic monitoring circuits, less and less current is required to operate the electronic input circuits of the destination device which results in higher input impedance and a need for less and less current to be drawn from the sourcing device on activation. The reduction in current results in a reduction in the power consumed by each of the input devices for on-board and wayside equipment. However, this reduction affects effectiveness of current sourcing devices as the minimum wetting current required to switch the device on is not met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
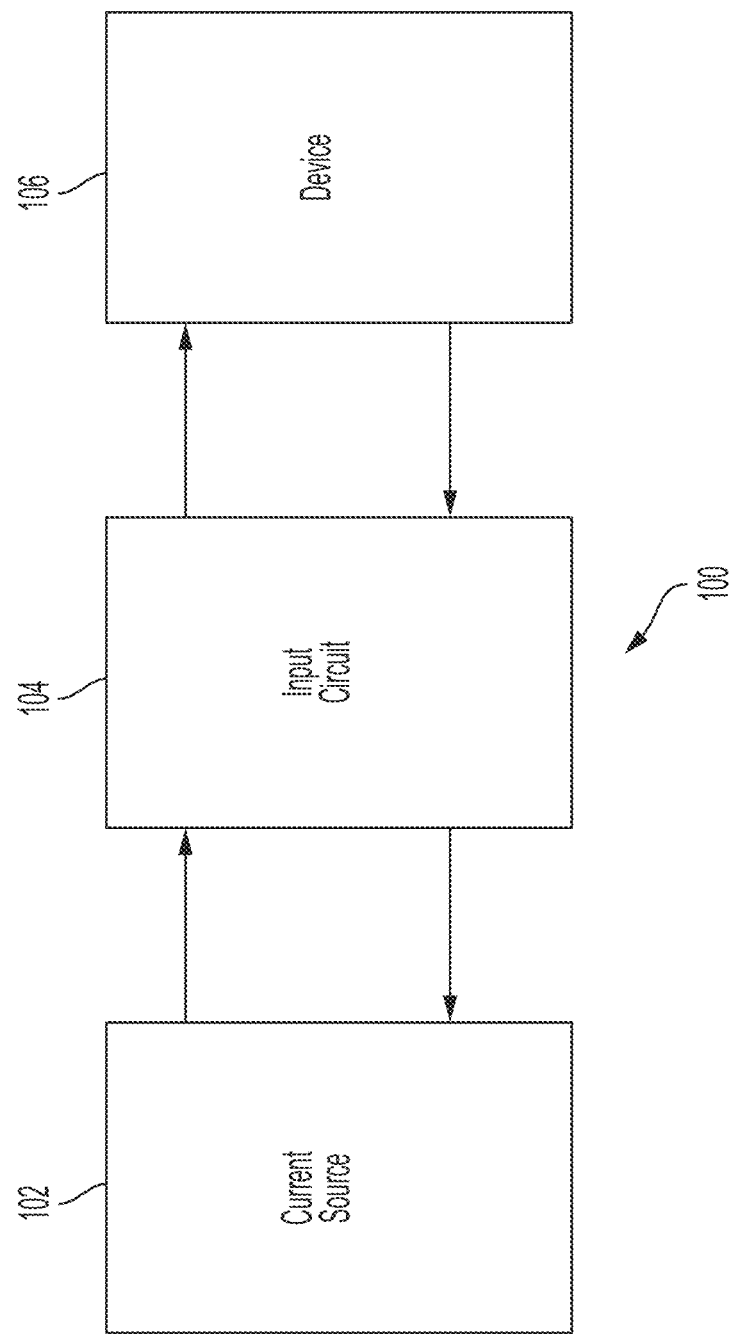
FIG. 1 depicts a power system for a device including a wetting input circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference to FIG. 1, a power system 100 for a device including a wetting input circuit is shown, in accordance with an embodiment. A current source 102 is electrically coupled with an input circuit 104 which is in turn electrically coupled with a device 106. The current source 102 transmits power to the device 106 through the input circuit 104. The device 106 has a minimum wetting current value. In some embodiments, the minimum wetting current value is specified by the device 106 manufacturer to meet minimum reliability measures. The input circuit 104 detects the presence of a current, above a threshold current value equal to the minimum wetting current value of the device 106, from the current source 102 and transmits the current to the device 106. When the current from the current source 102 is below the threshold current value, the input circuit 104 shunts the current so that current is not provided to the device 106.

Figure 2:
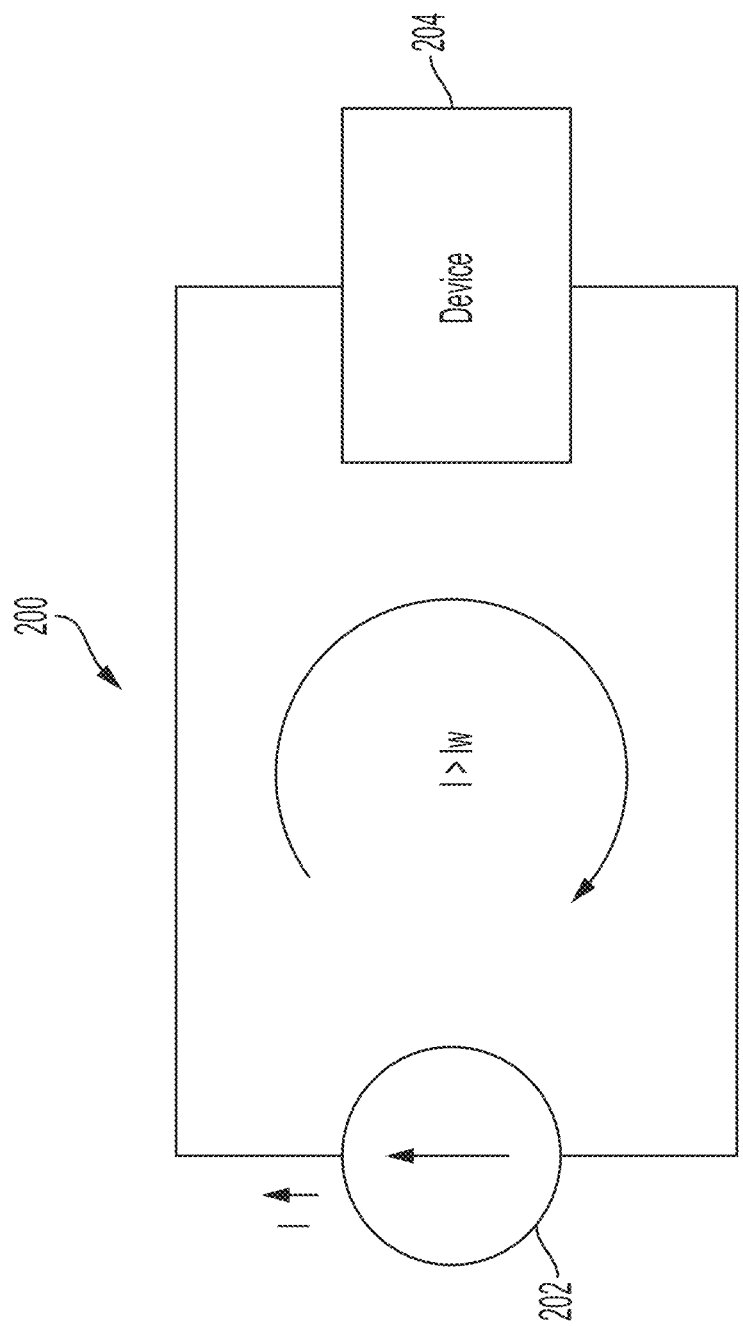
FIG. 2 depicts a simplified powering circuit, in accordance with some embodiments.

With reference to FIG. 2, a simplified powering circuit 200 is shown, in accordance with an embodiment. A current source 202 transmits a current I to a device 204. Device 204 has a minimum wetting current Iw. Device 204 activates if the current I exceeds the minimum wetting current Iw for the device 204. In some embodiments, device 204 is usable as device 106 (FIG. 1).

Figure 3:
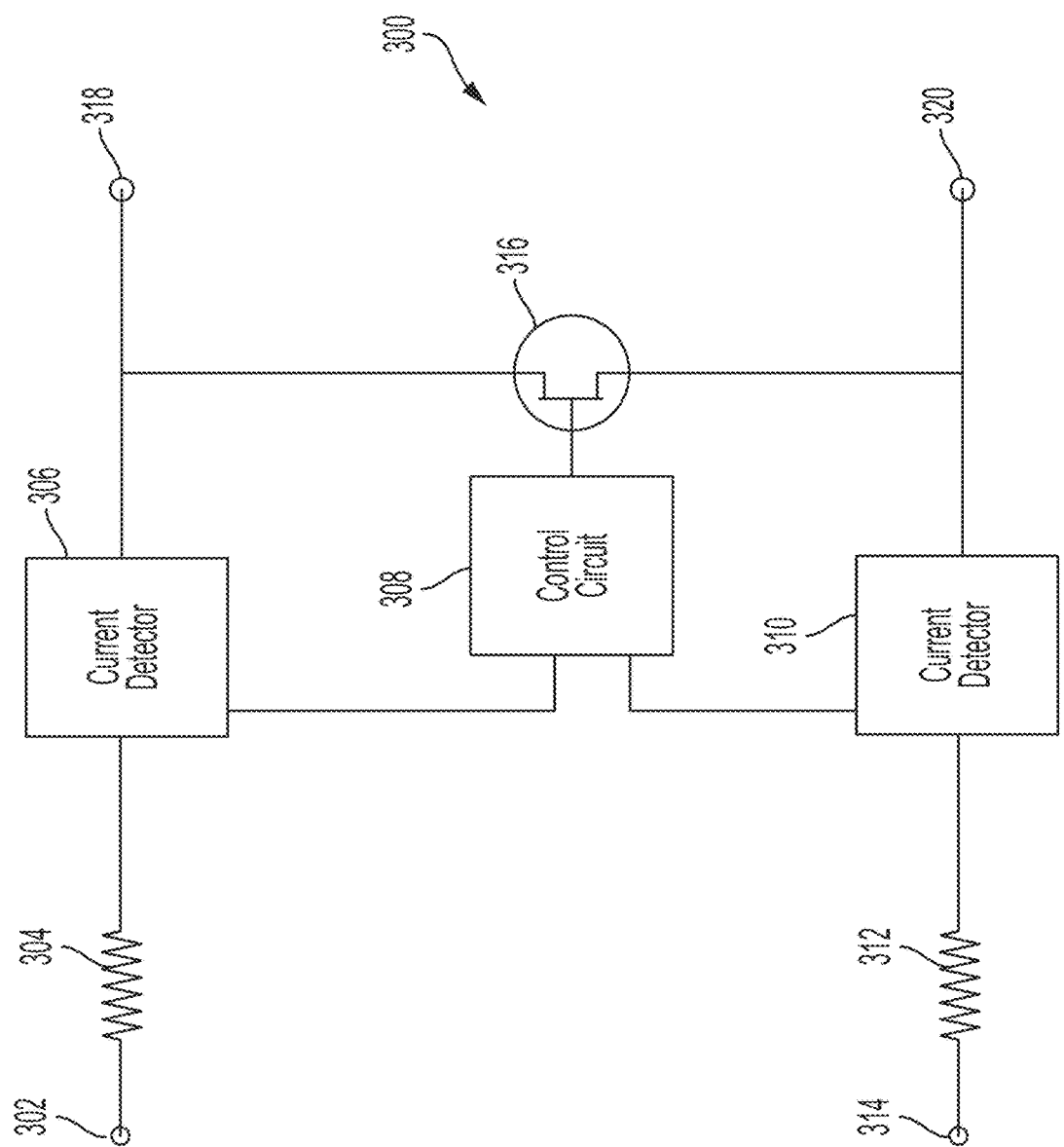
FIG. 3 depicts a wetting input circuit, in accordance with some embodiments.
Figure 12:
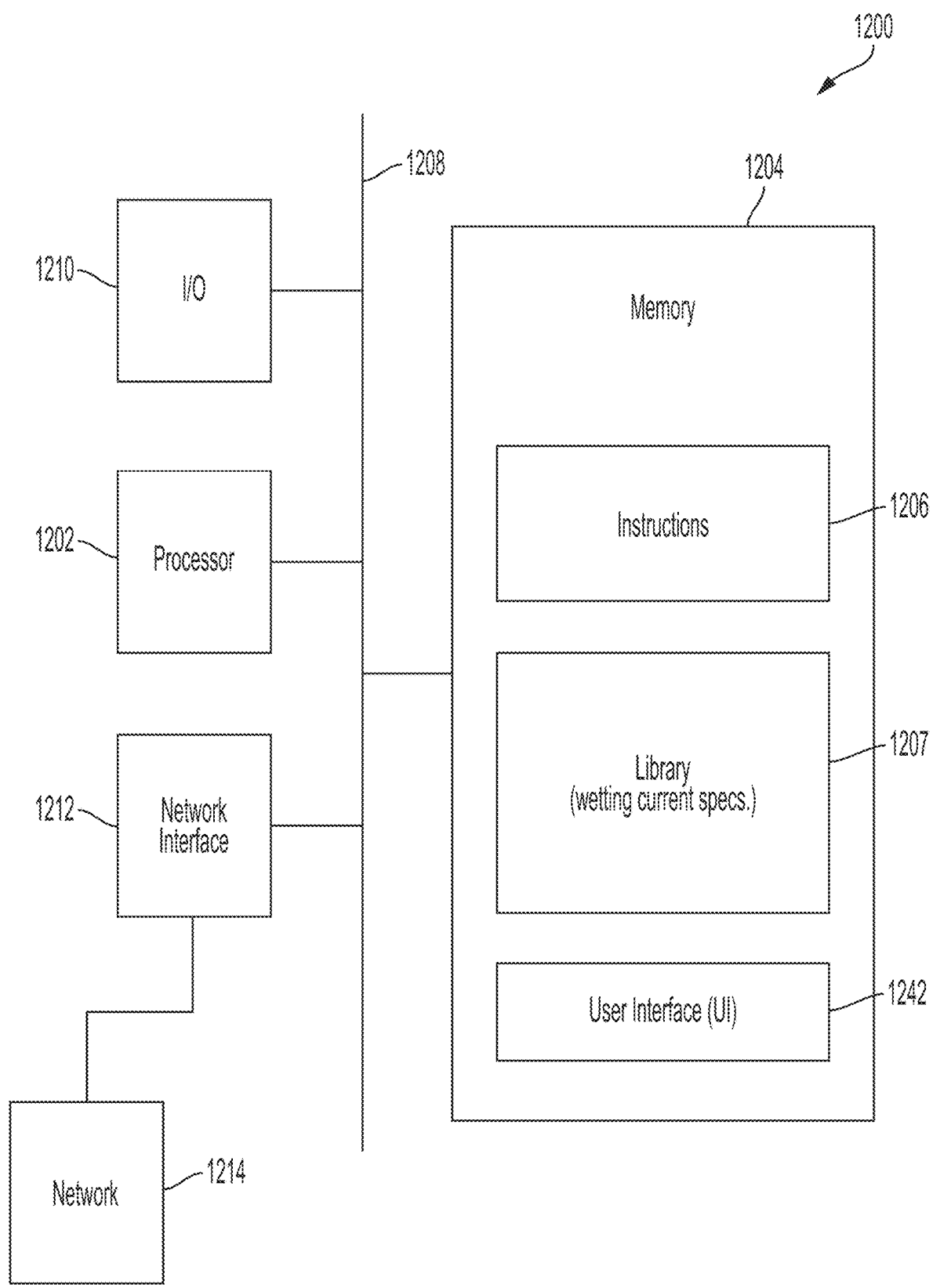
FIG. 12 is a high-level block diagram of a processor-based system usable in conjunction with one or more embodiments.

With reference to FIG. 3, a wetting input circuit 300 is shown, in accordance with an embodiment. In some embodiments, wetting input circuit 300 is usable as input circuit 104 (FIG. 1). Wetting input circuit 300 comprises a first current detector 306, a control circuit 308, a second current detector 310, and a switch 316. First current detector 306 is electrically coupled with an end of a resistor 304, an output terminal 318, a control circuit 308, and switch 316. The other end of resistor 304 is electrically coupled with an input terminal 302 which is in turn coupled with a current source, e.g., current source 102 (FIG. 1). In some embodiments, resistor 304 is a current limiting resistor. In some embodiments, output terminal 318 is electrically coupled with a device, e.g., device 106 (FIG. 1). The first current detector 306 generates a current level signal responsive to detection of a current from input terminal 302 (via resistor 304). The first current detector 306 transmits the current level signal to control circuit 308. Control circuit 308 is a processor-based system, in accordance with some embodiments. (FIG. 12)

In some embodiments, first current detector 306 compares the current received from input terminal 302 with the minimum wetting current value. First current detector 306 generates a current level signal. If the current received meets or exceeds the minimum wetting current value, first current detector 306 generates a current level signal indicating that the minimum wetting current value has been exceeded. If the current received is below the minimum wetting current value, first current detector 306 generates a current level signal indicating that the minimum wetting current value has not been exceeded. In some embodiments, if no current is received or if the current received is below the minimum wetting current value, first current detector 306 generates a current level signal indicating that the minimum wetting current value has not been exceeded. In some embodiments, if no current is received or if the current received is below the minimum wetting current value, first current detector 306 does not generate a current level signal. In some embodiments, the current level signal is the current value or a binary value indicative of whether the minimum wetting current value has been exceeded.

Second current detector 310 is electrically coupled with an end of a resistor 312, an input terminal 320, and control circuit 308, and switch 316. The other end of resistor 312 is electrically coupled with an output terminal 314 which is in turn coupled with the current source, e.g., current source 102 (FIG. 1). In some embodiments, resistor 312 is a current limiting resistor. In some embodiments, input terminal 320 is electrically coupled with the device, e.g., device 106 (FIG. 1). Similar to first current detector 306, second current detector 310 generates a current level signal responsive to detection of a current from output terminal 314 (via resistor 312). The second current detector 306 transmits the current level signal to control circuit 308.

In some embodiments, second current detector 310 compares the current received from output terminal 314 with the minimum wetting current value. Second current detector 310 generates a current level signal. If the current received meets or exceeds the minimum wetting current value, second current detector 310 generates a current level signal indicating that the minimum wetting current value has been exceeded. If the current received is below the minimum wetting current value, second current detector 310 generates a current level signal indicating that the minimum wetting current value has not been exceeded. In some embodiments, if no current is received or if the current received is below the minimum wetting current value, second current detector 310 generates a current level signal indicating that the minimum wetting current value has not been exceeded. In some embodiments, if no current is received or if the current received is below the minimum wetting current value, second current detector 310 does not generate a current level signal. In some embodiments, the current level signal is the current value or a binary value indicative of whether the minimum wetting current value has been exceeded.

Control circuit 308 is electrically coupled with first and second current detectors 306, 310, and switch 316. Control circuit 308 receives the current level signal from the first and second current detectors 306, 310 and generates a switch control signal for controlling switch 316.

If the current level signal indicates that the current is below the minimum wetting current value, control circuit 308 causes switch 316 to be in an ON mode (also referred to as a conducting or shunted state), i.e., control circuit 308 generates a switch control signal (ON signal) to turn on switch 316. If switch 316 is shunted, current flows from the first current detector 306 through switch 316 and to output terminal 314 via resistor 312 and current detector 310.

If the current level signal indicates that the current meets or exceeds a minimum wetting current value, control circuit 308 causes switch 316 to be in an OFF mode (also referred to as a non-conducting state), i.e., control circuit 308 generates a switch control signal (OFF signal) to turn off switch 316. If switch 316 is non-conducting, current flows from the first current detector 306 to output terminal 318 to the device and returns via input terminal 320 to second current detector 310 and on to output terminal 314 via resistor 312.

A current is transmitted to the circuit 300 through input terminal 302 and output terminal 314. The wetting input circuit 300 has an internal impedance represented by resistors 304 and 312. First current detector 306 detects the presence of an input current. Current detectors are electronic components which measure the current in the input circuit and provide the measured value to a control circuit. The measured value is either the actual measured value or an ON or OFF value based on threshold detection.

If no current, or a current below a threshold value, is detected by the current detector 306, the current detector 306 sends a signal (or a null signal) to control circuit 308. Control circuit 308 is a circuit which either commands the switch 316 to the ON state (conducting) or the OFF state (not conducting), based on the input from the current detectors. Switch 316 is an electronic device or a relay and its function is to allow the switching between the high impedance state of the electronic input and the low impedance state of the electronic input.

The control circuit 308 closes switch 316 which shunts the input 318 and output 320, so that no current flows between them via a connected device, e.g., device 106 (FIG. 1). If a current at or in excess of a threshold value is detected by the current detector 306, the current detector 306 sends a signal to control circuit 308. The control circuit 308 opens the switch 316 which causes the current to flow from the first current detector 306 to the input 318, the connected device, and back to input terminal 320. A second current detector 310 detects output current and sends a control signal (or a null signal) to the control circuit in the same fashion. The redundancy of the current detectors 306 and 310 assure proper operation of the control circuit and detect the failure of either current detector 306 or 310. In accordance with an embodiment, when one of the current detectors 306 or 310 fails then the input circuit continues to function and a failure is reported for maintenance. For proper operation of the circuit, only one of the current detectors 306 or 310 allows the input circuit to work. In accordance with an embodiment, if both current detectors 306 or 310 fail, the input circuit is in the safe state, i.e. no input.

Figure 4:
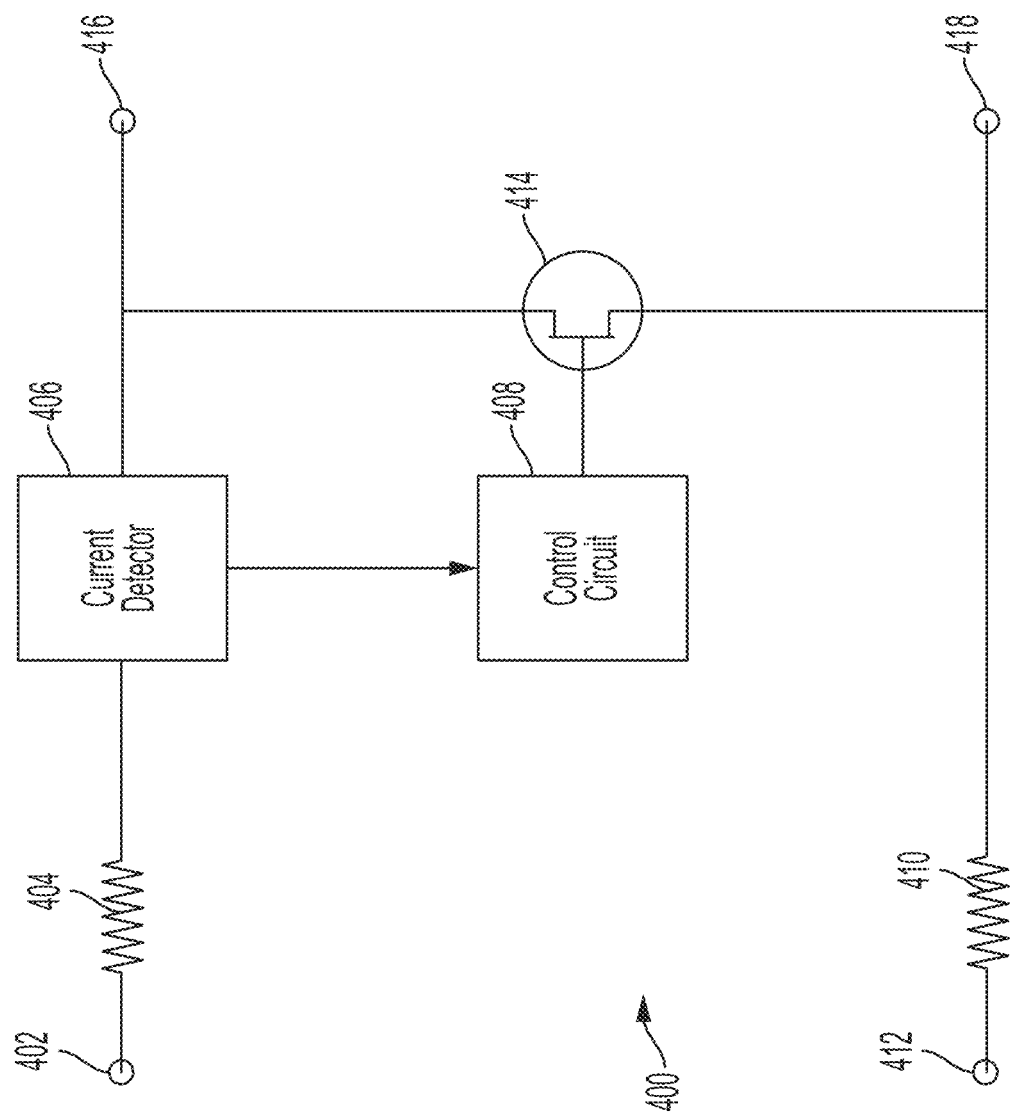
FIG. 4 depicts a wetting input circuit, in accordance with some embodiments.

With reference to FIG. 4, a wetting input circuit 400 is shown, in accordance with an embodiment. Wetting input circuit 400 is similar to wetting input circuit 300 without including a second current detector. In some embodiments, wetting input circuit 400 is usable as input circuit 104 (FIG. 1). Wetting input circuit 400 comprises a current detector 406, a control circuit 408, and a switch 414. Current detector 406 is electrically coupled with an end of a resistor 404, an output terminal 416, a control circuit 408, and switch 414. The other end of resistor 404 is electrically coupled with an input terminal 402 which is in turn coupled with a current source, e.g., current source 102 (FIG. 1). In some embodiments, resistor 404 is a current limiting resistor. In some embodiments, output terminal 416 is electrically coupled with a device, e.g., device 106 (FIG. 1). The current detector 406 generates a current level signal responsive to detection of a current from input terminal 402 (via resistor 404). The current detector 406 transmits the current level signal to control circuit 408. Control circuit 408 is a processor-based system, in accordance with some embodiments. (FIG. 12)

In some embodiments, current detector 406 compares the current received from input terminal 402 with the minimum wetting current value. Current detector 406 generates a current level signal. If the current received meets or exceeds the minimum wetting current value, current detector 406 generates a current level signal indicating that the minimum wetting current value has been exceeded. If the current received is below the minimum wetting current value, current detector 406 generates a current level signal indicating that the minimum wetting current value has not been exceeded. In some embodiments, if no current is received or if the current received is below the minimum wetting current value, current detector 406 generates a current level signal indicating that the minimum wetting current value has not been exceeded. In some embodiments, if no current is received or if the current received is below the minimum wetting current value, first current detector 406 does not generate a current level signal. In some embodiments, the current level signal is the current value or a binary value indicative of whether the minimum wetting current value has been exceeded.

A resistor 410 is coupled with an input terminal 412, and switch 414. The other end of resistor 410 is electrically coupled with an output terminal 412 which is in turn coupled with the current source, e.g., current source 102 (FIG. 1). In some embodiments, resistor 410 is a current limiting resistor. In some embodiments, input terminal 418 is electrically coupled with the device, e.g., device 106 (FIG. 1).

Control circuit 408 is electrically coupled with current detector 406 and switch 414. Control circuit 408 receives the current level signal from the current detector 406 and generates a switch control signal for controlling switch 414.

If the current level signal indicates that the current is below the minimum wetting current value, control circuit 408 causes switch 414 to be in an ON mode (also referred to as a conducting or shunted state), i.e., control circuit 408 generates a switch control signal (ON signal) to turn on switch 414. If switch 414 is shunted, current flows from the current detector 406 through switch 414 and to output terminal 412 via resistor 410.

If the current level signal indicates that the current meets or exceeds a minimum wetting current value, control circuit 408 causes switch 414 to be in an OFF mode (also referred to as a non-conducting state), i.e., control circuit 408 generates a switch control signal (OFF signal) to turn off switch 414. If switch 414 is non-conducting, current flows from the current detector 406 to terminal 416 to the device and returns via terminal 418 to output terminal 412 via resistor 410.

A current is transmitted to the circuit 400 through input 402 and output 412. The input circuit 400 has an internal impedance represented by resistors 404 and 410. A current detector 406 detects the presence of an input current. If no current, or a current below a threshold value, is detected by the current detector 406, the current detector 406 sends a signal (or a null signal) to a control circuit 408. The control circuit 408 closes switch 414 which shunts the input 416 and output 418, so that no current flows between them. If a current in excess of a threshold value is detected by the current detector 406, the current detector 406 sends a signal to a control circuit 408. The control circuit opens the switch 414 which provides the current to the terminal 416 to the device and returns via terminal 418.

Figure 5:
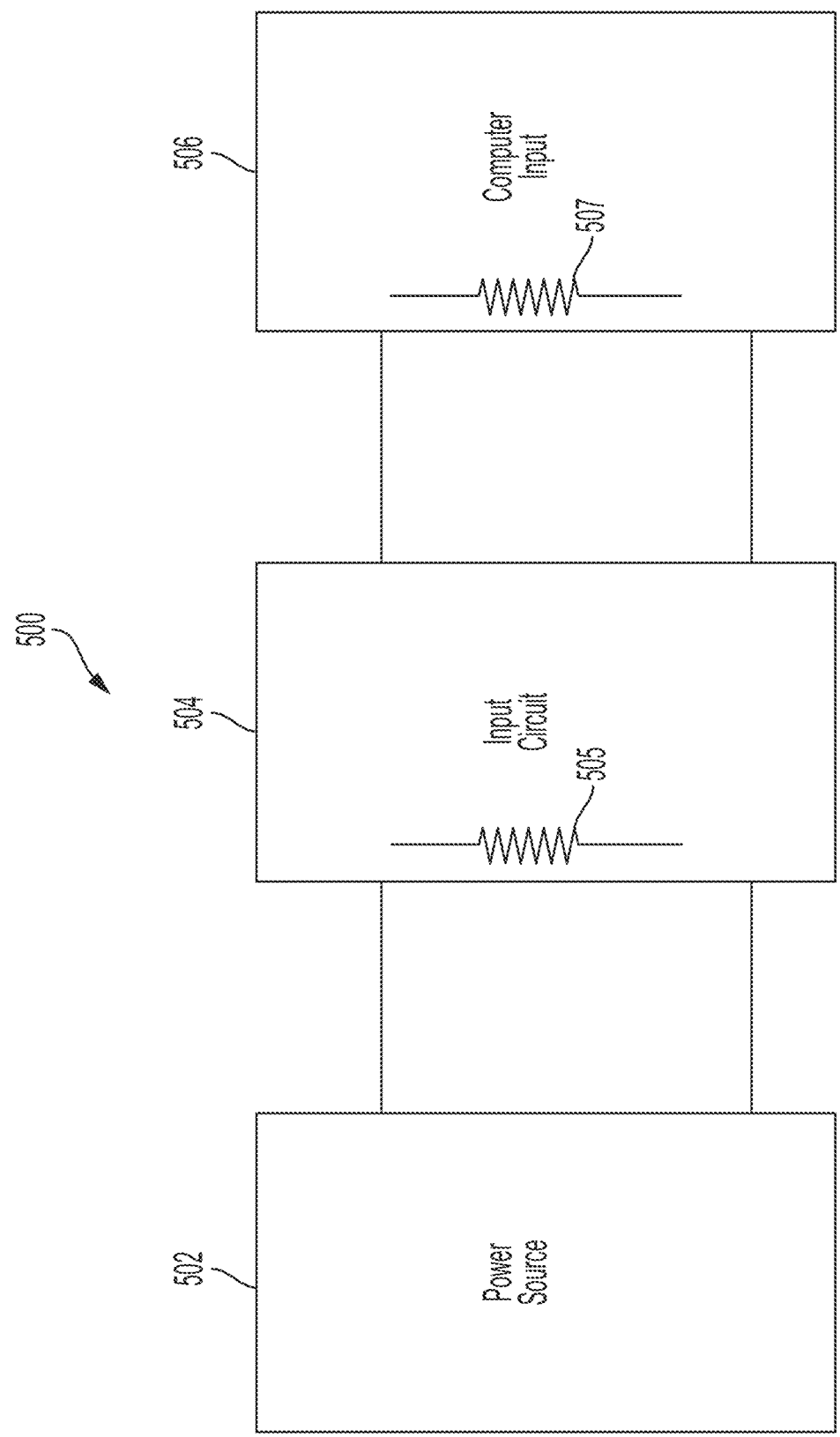
FIG. 5 depicts a power circuit, in accordance with some embodiments.

With reference to FIG. 5, a power system 500 is shown, in accordance with an embodiment. A power source 502 transmits power to a computer through a computer power input 506. The power transmitted by the power source 502 generates a current that passes into wetting input circuit 504. In some embodiments, wetting input circuit 504 is one or the other of wetting input circuit 300 or 400. The wetting input circuit 504 has an internal impedance represented by resistor 505. The computer input 506 has an internal impedance represented by resistor 507. The impedance presented by resistor 507 is larger than the impedance presented by resistor 505. The input circuit 504 detects current generated by the power source 502. If the current is below a threshold value, i.e., the minimum wetting current for the computer input 506, the input circuit 504 shunts the current through the input circuit and resistance 505. If the current is above a threshold value, i.e., the minimum wetting current for the computer input 506, the input circuit 504 provides the current to the computer input 506 and resistance 507.

Figure 6:
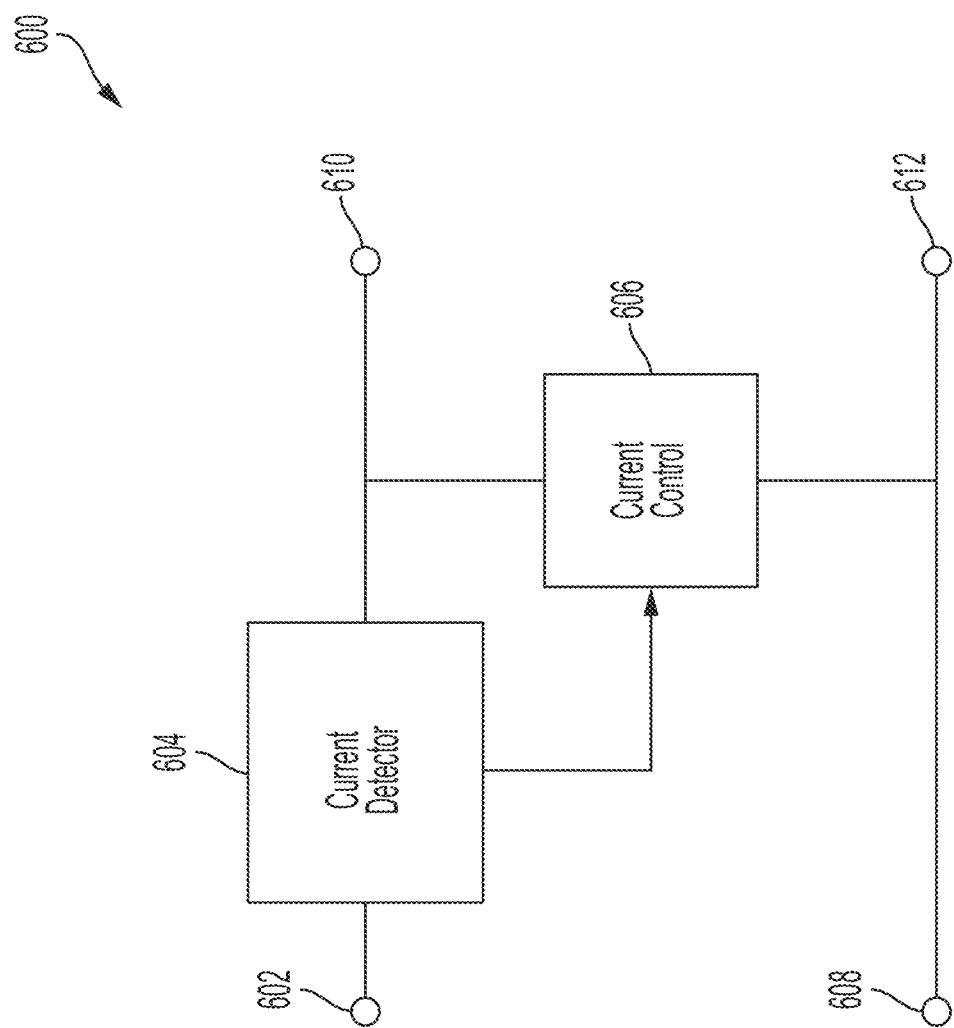
FIG. 6 depicts a wetting input system, in accordance with some embodiments.

With reference to FIG. 6, a wetting input circuit 600 is shown, in accordance with an embodiment. Wetting input circuit 600 is similar to wetting input circuit 300 and 400 with a current control 606 in place of a control circuit and switch. In some embodiments, wetting input circuit 600 is usable as input circuit 104 (FIG. 1). Wetting input circuit 600 comprises a current detector 604 and a current control 606. Current detector 604 is electrically coupled with an input terminal 602, an output terminal 610 and a current control 606. Input terminal 602 is coupled with a current source, e.g., current source 102 (FIG. 1). In some embodiments, output terminal 610 is electrically coupled with a device, e.g., device 106 (FIG. 1). The current detector 604 generates a current level signal responsive to detection of a current from input terminal 602. The current detector 604 transmits the current level signal to current control 606. Current control 604 is a processor-based system, in accordance with some embodiments. (FIG. 12)

In some embodiments, current detector 604 compares the current received from input terminal 602 with the minimum wetting current value. Current detector 604 generates a current level signal. If the current received meets or exceeds the minimum wetting current value, current detector 604 generates a current level signal indicating that the minimum wetting current value has been exceeded. If the current received is below the minimum wetting current value, current detector 604 generates a current level signal indicating that the minimum wetting current value has not been exceeded. In some embodiments, if no current is received or if the current received is below the minimum wetting current value, current detector 604 generates a current level signal indicating that the minimum wetting current value has not been exceeded. In some embodiments, if no current is received or if the current received is below the minimum wetting current value, first current detector 604 does not generate a current level signal. In some embodiments, the current level signal is the current value or a binary value indicative of whether the minimum wetting current value has been exceeded.

An input terminal 602 is coupled with a current control 606. An output terminal 608 is coupled with the current source, e.g., current source 102 (FIG. 1). In some embodiments, input terminal 610 is electrically coupled with the device, e.g., device 106 (FIG. 1).

Current control 606 is electrically coupled with current detector 604. Current control 606 receives the current level signal from the current detector 604 and controls the current between input terminal 610 and output terminal 612.

If the current level signal indicates that the current is below the minimum wetting current value, current control 606 allows current to flow from the current detector 604 to terminal 608.

If the current level signal indicates that the current meets or exceeds a minimum wetting current value, current control 606 allows current to flow from the current detector 604 to terminal 610 to the device and returns via terminal 612 to terminal 608.

Power is generated between input 602 and output 608. A current detector 604 detects current and provides a control signal to a control circuit 606. If the detected current is above the threshold wetting current value for load 610, the current is provided to the load 610. If the detected current is below the threshold wetting current value for load 610, the current is shunted away from the load 610.

Figure 7:
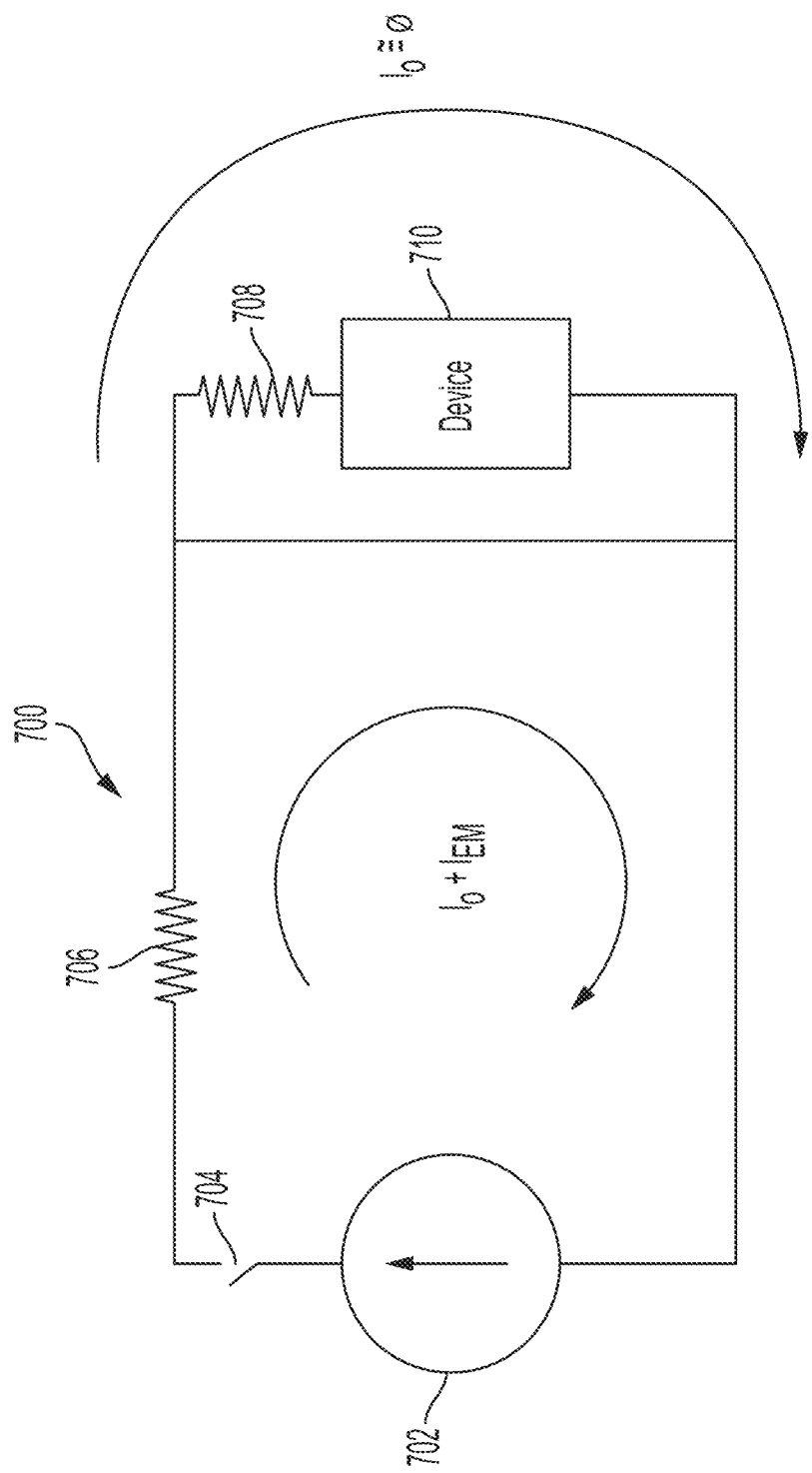
FIG. 7 depicts a simplified power circuit, in accordance with some embodiments.

With reference to FIG. 7, a simplified power circuit 700 is shown. The simplified power circuit 700 shows the state of the input circuit 104 when the current detected by current detector 306 or 406 is less than a threshold value and switch 316 or 414 is closed. A current source 702, for example current source 102 (FIG. 1) is connected to a switch 704 that is opened to indicate that the power to the input circuit 104 is turned OFF. Impedance 706 is connected to open switch 704 and the other end of impedance 706 is connected to the current source 702. Impedance 706 is connected in series with device 710 which has an internal impedance represented by impedance 708 A current source 702 is disconnected from the device 710 (turned off) by switch 704. The current passing through the device 710 is zero or insignificant, i.e., below the wetting current of device 710. A shunting path through is connected to the device 710. The current provided to the device 710 is approximately zero. The current $I_o$ represents the current when the current source is disconnected and is approximately equal to zero. The current $I_{EM}$ represents the current in the circuit due to electromagnetic waves or fluctuations. Any stray current $I_{EM}$ is.

Figure 8:
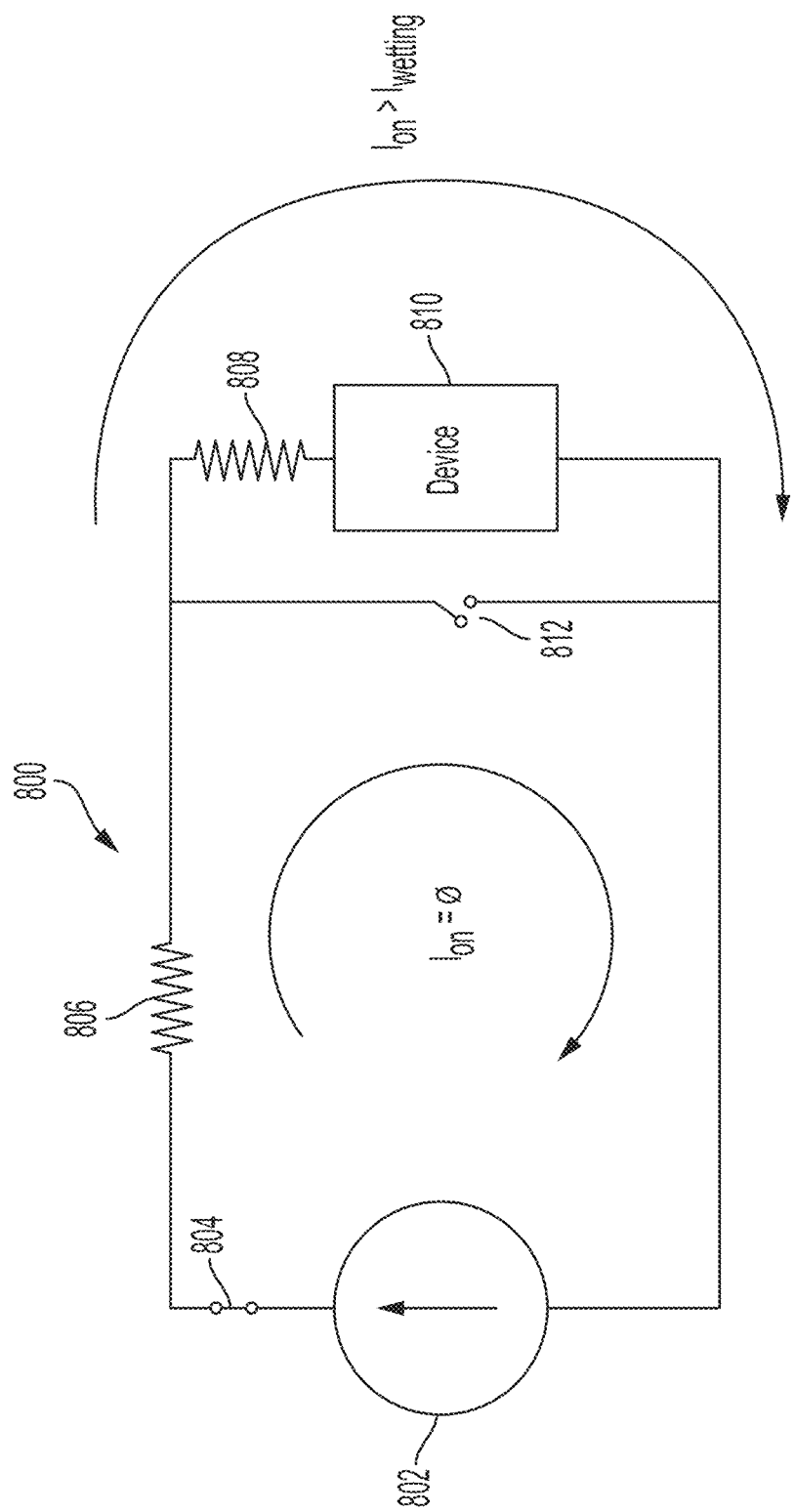
FIG. 8 depicts a simplified power circuit, in accordance with some embodiments.

With reference to FIG. 8, a simplified power circuit 800 is shown. The simplified power circuit 800 shows the state of the input circuit 104 (FIG. 1) when the current detected by current detector 306 or 406 is greater than a threshold value and switch 316 or 414 is open. A current source 802, for example current source 102 (FIG. 1) is connected to a switch 804 that is closed to indicate that the power to the input circuit 104 is turned ON. Impedance 806 is connected to closed switch 804 and the other end of impedance 806 is connected to an open switch 812. The open switch 812 is connected at the other end to the current source 802. Impedance 806 is connected in series with device 810 which has an internal impedance represented by impedance 808 A current source 802 is connected to the device 810 (turned on) by switch 804. The current passing through the device 810 is above the wetting current of device 810. A shunting path is disconnected from the circuit 800 by switch 812.

Figure 9:
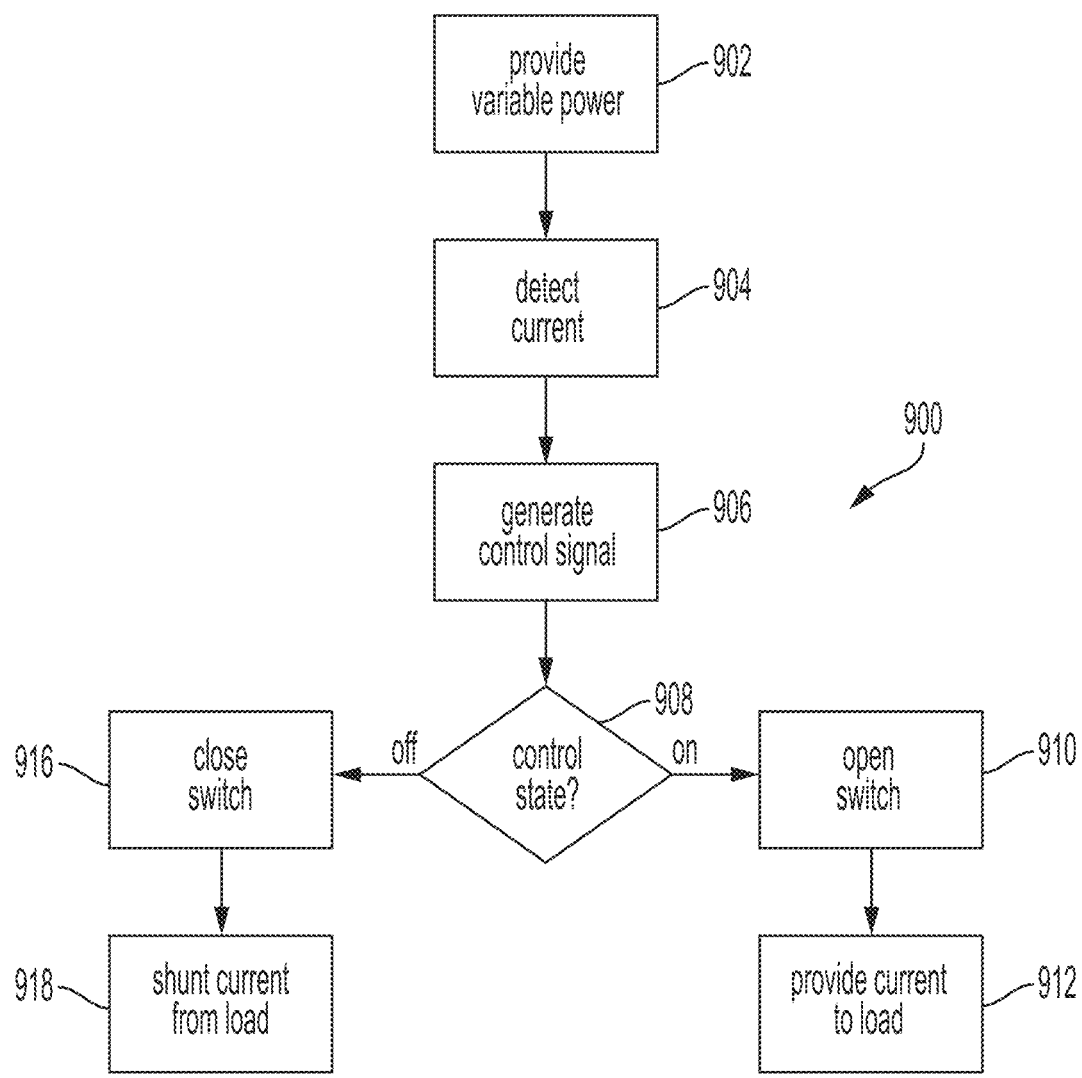
FIG. 9 depicts a method of operating a wetting current control, in accordance with some embodiments.

With reference to FIG. 9, a method of operating a wetting current control 900 is shown, in accordance with an embodiment. An input circuit, for example input circuit 104 (FIG. 1) is connected to a variable power source, for example current source 102 (FIG. 1) that provides power to the input circuit when on and provides no power to the input circuit when off in step 902. The current provided by the power source is detected by a current detector, for example current detector 306 (FIG. 3) or current detector 406 (FIG. 4) in step 904. The current detector provides a control signal to a control circuit, for example control circuit 308 (FIG. 3) in step 906. If the control signal indicates that the current has a value equal to or greater than the wetting current of the load in decision step 908, the control circuit opens a switch in step 910. Current is provided to the load in step 912. If the control signal indicates that the current has a value less than the wetting current of the load in decision step 908, the control circuit closes the switch in step 916 thereby shunting the current through the switch and away from the load in step 918.

Figure 10:
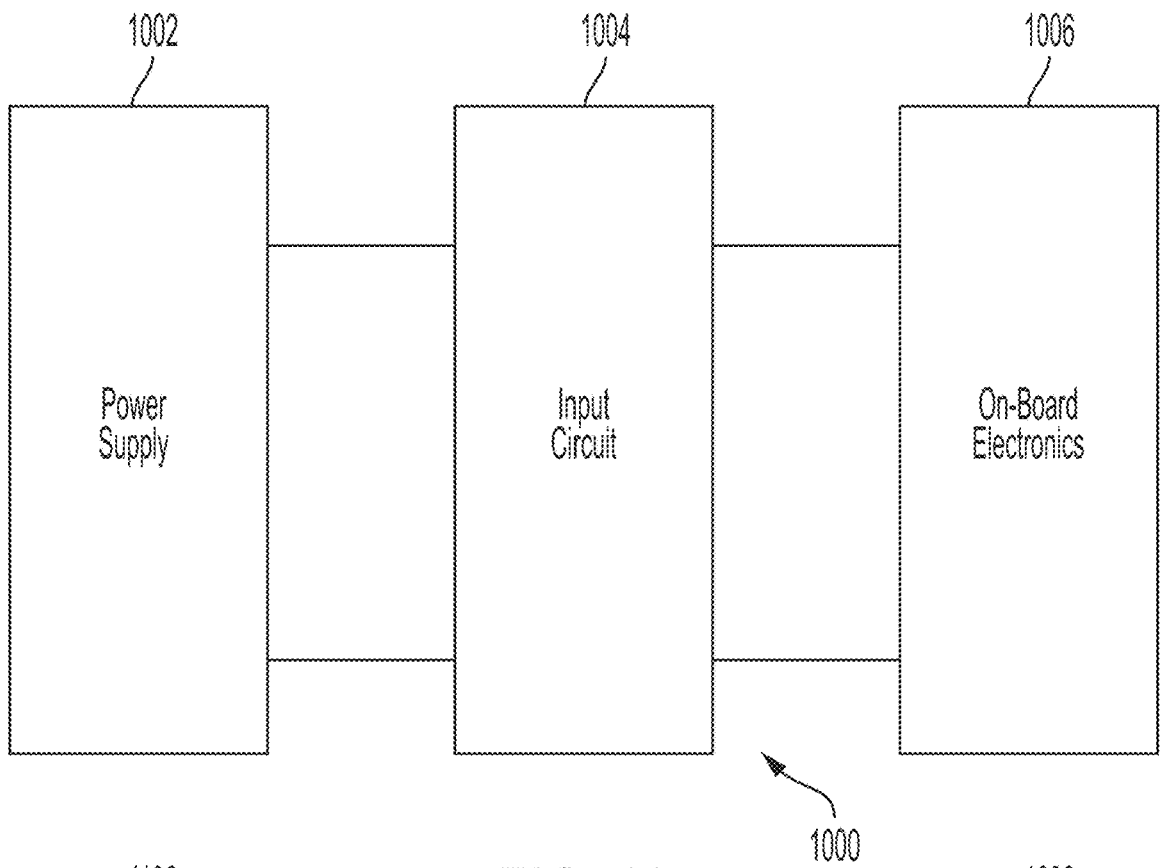
FIG. 10 depicts a power system for on-board electronics, in accordance with some embodiments.

With reference to FIG. 10, a power system for on-board electronics 1000 is shown, in accordance with an embodiment. A power supply 1002, for example current source 102 (FIG. 1) generates a current. The current generated by the power supply 1002 is detected by input circuit 1004, for example input circuit 104 (FIG. 1). If the current is less than the wetting current of on-board electronics 1006, the device 106 (FIG. 1), the input circuit 1004 shunts the current away from the on-board electronics 1106. If the current is greater than the wetting current of on-board electronics 1006, the current is provided to the on-board electronics 1006.

Figure 11:
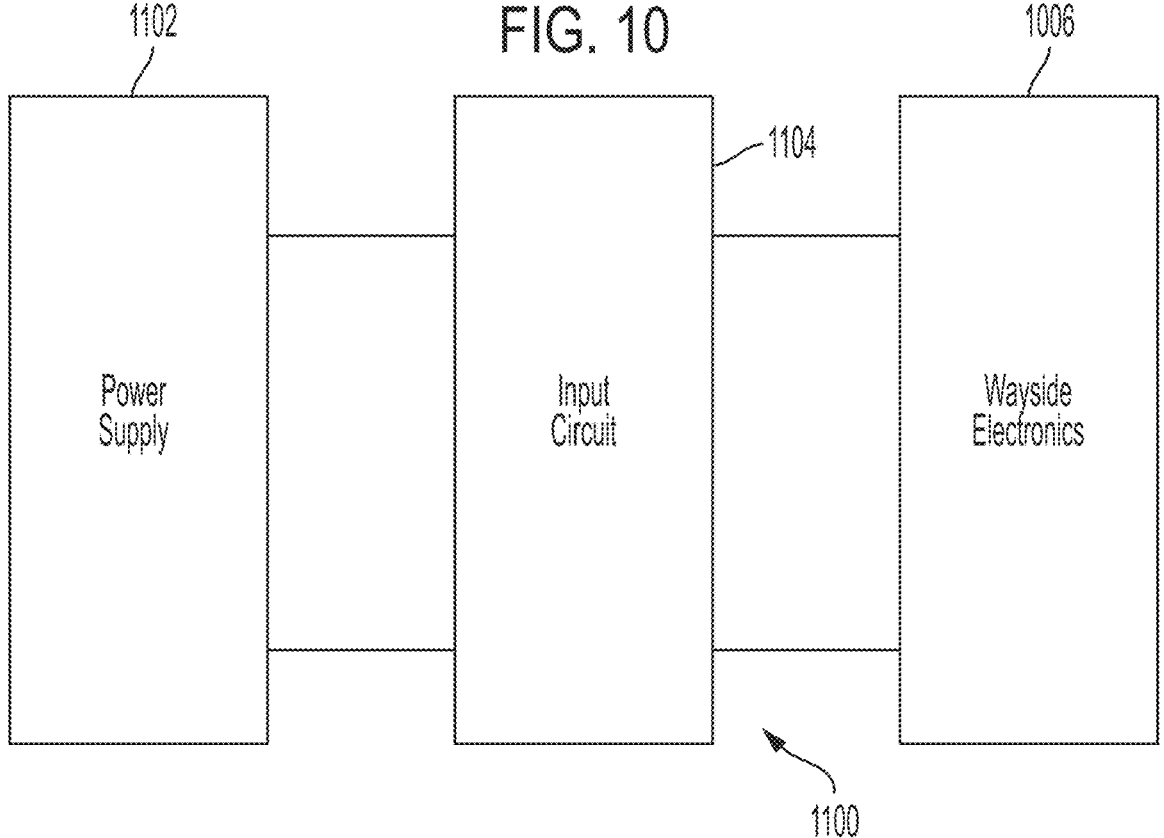
FIG. 11 depicts a power system for way-side electronics, in accordance with some embodiments.

With reference to FIG. 11, a power system for way-side electronics 1100 is shown, in accordance with an embodiment. A power supply 1102, for example current source 102 (FIG. 1) generates a current. The current generated by the power supply 1102 is detected by input circuit 1104, for example, the input circuits of FIG. 3 or FIG. 4. If the current is less than the wetting current of way-side electronics 1106, for example, the device 106 of FIG. 1, the input circuit 1104 shunts the current away from the way-side electronics 1106. If the current is greater than the wetting current of way-side electronics 1106, the current is provided to the way-side electronics 1106.

One or more embodiments of the present disclosure are related to an input circuit for on-board and wayside equipment with respect to the control of the input wetting current for such equipment. One or more embodiments further ensure that under all operating conditions the minimum wetting current for input devices exceeds the recommended manufacturer's wetting current specification. One or more embodiments address the conflicting requirements as stated above without the need to increase power consumption of the electronic input devices.

One or more embodiments are using in railway signaling; however, one or more embodiments of the present disclosure are applicable for input devices needing increased wetting current or greater immunity to EMI. One or more embodiments are suited for vital (safety) circuits where the permissive state of an input is the energized state and where a reduction in power consumption benefits the design. One or more embodiments also find use in electronic equipment requiring larger immunity to EMI in the input OFF state and where wetting current specification points to a need for increased input current due to high impedance input devices.

One or more embodiments of the invention include designing a two-stage electronic input circuit which provides the sourcing device with two values of impedance. A low impedance value when the device is de-energized and a high impedance value when the sourcing device has been detected as energized.

One or more embodiments of the invention include a circuit for controlling an input current, the circuit includes a first input port configured to receive the input current. A current detector detects an input current value of the input current and generates a control signal indicative of the input current value. A first output port outputs an output current to a load. A second output port receives the output current from the load. A control circuit provides a low-impedance path in parallel with the load in response to the control signal indicating the input current value is below a threshold value.

As discussed above, the sourcing devices need to be assured that the wetting current needed when the sourcing device is turned on is larger than the minimum sourcing current specified by the sourcing device manufacturer. When the sourcing device is in the de-energized state no current will flow in the electronic input circuit at which point the input impedance of the electronic input as seen by the sourcing device will be low.

After the sourcing device energizes the input (on state), the current flowing between the source circuit and the electronic input will be high due to the low impedance of the circuit and the current flowing will be above the wetting current threshold. After the electronic input detects that the input has been energized through current detector circuits, the input impedance is increased to a value dictated by the impedance of the computer input. This impedance is much higher and thus results in a reduction of the current flowing in the circuits and the energy used.

The fact that the circuit presents a low impedance input to the sourcing device while the input is de-energized (off state), increases the immunity of the circuit to EMI by shunting electronic noise from the high impedance of the computer input. After the input remains on, the circuit impedance remains high and the current is dictated by the high impedance of the computer input.

After the input de-energizes (off state), the circuit reverts automatically to the low impedance state.

In operation, when the sourcing device is de-energized (OFF state), the current detectors measure a current which is below the detection threshold and provide this information to the control circuit which turns ON (conducting state) the switch. This presents a low impedance input to the sourcing device and shunts the computer input from the external world thus increasing its immunity to stray EMI.

When the sourcing device is energized (ON state), the current flowing in the circuit is due to the low impedance of the circuit and thus at a value greater than the minimum wetting current that the device needs. Thus, at the point of switching ON, the current flowing exceeds the minimum value specified.

Current detectors detect the larger current and thus indicate to the control circuit that the input is energized. Control circuit then turns off switch and the switch stops conducting. As a result, the shunt across the computer input is eliminated and the current flows into the computer input. This turns on computer input although at a lower value as the circuit now contains the high input impedance of the computer input.

While the input remains energized, the current sourced remains at the value dictated by the high impedance of the circuit.

When the sourcing device is de-energized (OFF state), the reduced current is detected by current detectors which informs control circuit which in turn energizes switch. This results in presenting a low impedance value to the sourcing device.

The above sequence of operation continues whenever the sourcing device is turned ON or OFF.

The circuit includes two current detectors in each leg of the circuit to improve reliability of the circuit. In at least some embodiments, the circuit operates with a single current detector. In at least some embodiments, failures of a detector are detected and indicated to the control circuit for maintenance notification.

One or more embodiments of the input circuit, by providing a low impedance current path shunted via the switch, ensure that when an input is energized sufficiently, current flows in the circuit which provides for the necessary wetting current to the sourcing device. After the switch opens as a result of the input being detected as energized by the current sensing detectors, the current in the circuit drops to the current drawn by the high impedance input device. This operation substantially reduces the current used by the circuit, reduces power consumption and provides higher initial input current to assure proper wetting current to the sourcing device only when the input changes from low to high, in at least some embodiments.

One or more embodiments advantageously increases the wetting current to the values specified by the source device manufacturer. One or more embodiments advantageously increases the immunity of the electronic input circuit to EMI by requiring a higher current to turn on the input. One or more embodiments advantageously eliminates the need for additional power devices to increase the input current and thus the need of larger power supplies and heat dissipation resistors.

One or more embodiments avoid the need to increase the current consumption of the devices and avoiding the resulting need to increase the size of power supplies and the added cost of energy. Additionally, one or more embodiments avoid the additional cost accrued as a result of the need to rid the added power and a corresponding increase in cabinet size, wire size, and the addition of fans.

One or more embodiments satisfy the increase of the wetting current specified by a manufacturer without increasing the power consumption. One or more embodiments, increase the immunity to EMI, in particular, when the input is not energized. One or more embodiments reduce power consumption in comparison with other methods for increasing the wetting current by electronic input devices.

In at least one aspect, the present disclosure includes a circuit for controlling a wetting current. The circuit comprises a current detector for measuring a current; a control circuit electrically coupled with the current detector and configured to generate a control signal based on the measured current value; and a switch coupled with the control circuit and configured to have a conducting state and a non-conducting state responsive to the control signal. When the switch is in the conducting state it is configured to shunt current across a device input and when the switch is in the non-conducting state it is configured to allow current to flow to the device input.

In accordance with an embodiment, the input circuit detects current in the input and current limiting resistors. When the current in the input circuit is below a threshold, the switch, such as 316 or 414, is closed basically shorting the load. When there is current, the switch, such as 316 or 414, is open allowing current to flow to the load in high impedance configuration.

In accordance with an embodiment, the resistor, such as 708 or 808, is in series with the load, such as 710 or 810, is a high impedance, relative to the current limiting resistor at the input, such as 304 or 404.

In accordance with an embodiment, a computer circuit presents both a high impedance and low impedance to a source. In accordance with an embodiment, high impedance is presented to the source load when current is flowing in the circuit above a threshold and a low impedance is presented to the source load when the current is low or zero. In accordance with an embodiment, the low impedance allows for wetting currents when the source input is turning from off to on. A transition from low impedance to high impedance configuration after a short time period when input current is detected from the source. A low impedance configuration is restored when the source current is below a threshold or zero.

In accordance with an embodiment, the circuit is used as an input circuit for external signals in onboard and wayside application, to minimize power consumption and control wetting current. In many applications the status for the input is relays. These relays are connected to a wetting current. Otherwise their reliability is affected. Sometimes the relays are not in the cleanest environment and they need a wetting current to clean the contacts. A wetting current consumes more power and generates heat that needs to be disposed of. The input circuit provides a wetting current and reduces power consumption and heat.

FIG. 12 is a block diagram of a control circuit 1200 in accordance with some embodiments.

In some embodiments, control circuit 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) a control circuit which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of one or more wetting current minimum values as disclosed herein.

Control circuit system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

Control circuit system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, wetting current minimum value(s), and/or other parameters for processing by processor 1202. The information is transferred to processor 1202 via bus 1208. Control circuit system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of a control circuit tool. In some embodiments, a portion or all of the noted processes and/or methods is implemented as a software application that is used by control circuit system 1200.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for controlling an input current, the circuit comprising: a first input port configured to receive the input current;
   a first current detector configured to detect an input current value of the input current and generate a control signal indicative of the input current value;
   a first output port configured to output an output current to a load;
   a second output port configured to receive the output current from the load; and
   a control circuit configured to provide a low-impedance path in parallel with the load in response to the control signal indicating the input current value below a threshold value, further comprising a first series resistor connecting the first input port to the current detector; and a second series resistor connected to the second output port, wherein a switch connects between the first resistor and the second resistor and wherein the first resistor has a lower resistance value than the second resistor in series with the load.

2. The circuit of claim 1 further comprising:
   a second current detector for measuring a current at second input port of the circuit, the control circuit electrically coupled with the second current detector and configured to generate the control signal based on the measured current value of the second current detector.

3. The circuit of claim 2, wherein the second resistor connects the second current detector to the second input port of the circuit.

4. The circuit of claim 1, wherein at least one of the first resistor or the second resistor are current limiting resistors.

5. A method of controlling an input current, the method comprising:
   detecting, by a first current detector, an input current value of the input current
   at a first input port of a circuit;
   generating, by the first current detector, a control signal indicative of the input current value;
   outputting an output current to a load; receiving the output current from the load; and
   providing, by a control circuit, a low-impedance path in parallel with the load in response to the control signal indicating the input current value is below a threshold value, and wherein a first series resistor connects the first input port to the current detector; and a second series resistor connects to a second output port, wherein a switch connects between the first resistor and the second resistor and wherein the first resistor has a lower resistance value than the second resistor in series with the load.

6. The method of claim 5, wherein the load is a computer input.

7. The method of claim 5, wherein the load is on-board electronic equipment.

8. The method of claim 5, wherein the load is way-side electronic equipment.

9. The method of claim 5, wherein the control signal is indicative of an "ON" state.

10. The method of claim 5, wherein the control signal is indicative of an "OFF" state.

11. The method of claim 5, wherein the control circuit provides a low-impedance path by closing a switch across the load.

12. The circuit of claim 5, wherein at least one of the first resistor or the second resistor are current limiting resistors.

13. The circuit of claim 5, wherein the second resistor connects the second current detector to the second input port of the circuit.

14. A method of controlling an input current, the method comprising:
    providing variable power to a load;
    detecting, by a first current detector, an input current value of the input current at a first input port of a circuit;
    generating, by the first current detector, control signals indicative of the input current value;
    when the input current value is above a threshold value, in response to a first control signal, outputting an output current to a load and receiving the output current from the load;
    when the input current value is below the threshold value, or zero in response to a second control signal, providing a low-impedance path in parallel with the load; wherein a first series resistor connects the first input port to the current detector and a second series resistor connects to a second output port, wherein a switch connects between the first resistor and the second resistor and wherein the first resistor has a lower resistance value than the second resistor in series with the load.

15. The method of claim 14, wherein the load is a computer input.

16. The method of claim 14, wherein the load is on-board electronic equipment.

17. The method of claim 14, wherein the load is way-side electronic equipment.

18. The method of claim 14, wherein the control circuit provides a low-impedance path by closing a switch across the load.

19. The circuit of claim 14, wherein at least one of the first resistor or the second resistor are current limiting resistors.

20. The circuit of claim 14, wherein the second resistor connects the second current detector to the second input port of the circuit.

* * * * *